United States Patent
Tsuda et al.

(10) Patent No.: US 8,075,943 B2
(45) Date of Patent: *Dec. 13, 2011

(54) PURIFICATION PROCESS FOR ORGANIC ELECTRONICS MATERIAL

(75) Inventors: Yoshihiro Tsuda, Tsukuba (JP); Yoshii Morishita, Tsukuba (JP); Satoyuki Nomura, Tsukuba (JP); Yousuke Hoshi, Tsukuba (JP); Shigeaki Funyuu, Tsukuba (JP); Farshad J. Motamedi, Claremont, CA (US); Li-Sheng Wang, Arcadia, CA (US)

(73) Assignees: Hitachi Chemical Co., Ltd., Tokyo (JP); Maxdem Incorporated, San Dimas, CA (US)

( * ) Notice: Subject to any disclaimer, the term of this patent is extended or adjusted under 35 U.S.C. 154(b) by 943 days.

This patent is subject to a terminal disclaimer.

(21) Appl. No.: 11/317,253

(22) Filed: Dec. 27, 2005

(65) Prior Publication Data

US 2007/0159069 A1   Jul. 12, 2007

(51) Int. Cl.
*B05D 5/06* (2006.01)
*C08F 2/00* (2006.01)

(52) U.S. Cl. .............................. 427/66; 526/69; 528/487

(58) Field of Classification Search .................. 427/66; 445/24; 428/917; 313/504; 528/487; 526/69
See application file for complete search history.

(56) References Cited

U.S. PATENT DOCUMENTS

| | | | |
|---|---|---|---|
| 4,855,400 A * | 8/1989 | van Broekhoven et al. | 528/392 |
| 7,255,936 B2 | 8/2007 | Doi et al. | |
| 2003/0062523 A1 * | 4/2003 | Bae et al. | 257/72 |
| 2003/0104476 A1 * | 6/2003 | Fagan et al. | 435/7.1 |
| 2004/0254336 A1 * | 12/2004 | Xiao et al. | 528/373 |
| 2004/0260090 A1 * | 12/2004 | Treacher et al. | 544/224 |
| 2006/0247474 A1 * | 11/2006 | Tsuda et al. | 564/437 |
| 2007/0275628 A1 | 11/2007 | Tsuda et al. | |

FOREIGN PATENT DOCUMENTS

| | | |
|---|---|---|
| CN | 1329100 A | 1/2002 |
| CN | 1421470 A | 6/2003 |
| EP | 283092 A1 | 9/1988 |
| JP | 11-171801 A | 6/1999 |
| JP | 2000-327639 A | 11/2000 |
| JP | 2001-316338 A | 11/2001 |
| JP | 2002-080433 A | 3/2002 |
| JP | 2003-155476 A | 5/2003 |
| JP | 2004-331586 A | 11/2004 |
| WO | WO 90/13148 A1 | 11/1990 |
| WO | WO 00/41443 A1 | 7/2000 |
| WO | WO 03-048225 A2 * | 6/2003 |
| WO | 2004/108800 A1 | 12/2004 |

OTHER PUBLICATIONS

Abstract of WO 2004/113420; Dec. 29, 2004.*
Igor Sokolik et al., Blue-light electroluminescence from *p*-phenylene vinylene-based copolymers, J. Appl. Phys., Sep. 1, 1993, p. 3584-p. 3586, vol. 74, American Institute of Physics.
Heather D. Maynard et al., "Purification Technique for the Removal of Ruthenium from Olefin Metathesis Reaction Products", Tetrahedron Letters, Mar. 1999, p. 4137-4140, Elsevier Science Ltd.
Chinese Office Action dated Aug. 24, 2007 of CN 200480015571.7.
Japanese Office Action dated Jul. 13, 2010, issued in corresponding Japanese Patent Application No. 2005-507250.

* cited by examiner

*Primary Examiner* — James Lin
(74) *Attorney, Agent, or Firm* — Westerman, Hattori, Daniels & Adrian, LLP

(57) ABSTRACT

Objects of the present invention are to provide a purification process that enables Pd contained in an organic electronics material to be removed effectively, to provide an electroluminescent device middle layer material purified by the process, and to provide an electroluminescent device employing the middle layer material. The present invention relates to a process for purifying an organic electronics material, the process involving treating, with a phosphorus-containing material, an organic electronics material that contains Pd as an impurity so as to remove the Pd.

2 Claims, No Drawings

PURIFICATION PROCESS FOR ORGANIC ELECTRONICS MATERIAL

BACKGROUND OF THE INVENTION

1. Field of the Invention

The present invention relates to a purification process for an organic electronics material, an electroluminescent device middle layer material purified by the process, and an electroluminescent device employing the middle layer material.

2. Description of the Related Art

Electroluminescent devices have been attracting attention as, for example, large-area solid state light sources to replace incandescent lamps and gas-filled lamps. They have also been attracting attention as self-luminous displays, and are the most promising alternative to liquid crystal displays in the flat panel display (FPD) field. In particular, an organic electroluminescent (EL) device, in which the device material is formed from an organic material, is being commercialized as a low power consumption full-color FPD. Above all, polymer-based organic EL devices will be indispensable for future large-screen organic EL displays since the organic material of the polymer-based organic EL devices is formed from a polymer material for which film formation by printing, ink-jet, etc. is simple compared with low molecular weight-based organic EL devices, which require film formation in a vacuum system.

Conventionally, polymer-based organic EL devices employ either a conjugated polymer such as poly(p-phenylene-vinylene) (see e.g. International Publication WO90/13148) or a non-conjugated polymer (see e.g. I. Sokolik, et al., J. Appl. Phys. 1993. 74, 3584) as the polymer material. However, their luminescence lifetime as a device is short, which gives rise to problems when constructing a full-color display.

With the object of solving these problems, polymer-based organic EL devices having a middle layer between a light-emitting layer and an electrode have been proposed in recent years, but they are not satisfactory in terms of stability. This is due to impurities contained in a middle layer material and, in particular, the presence of Pd.

SUMMARY OF THE INVENTION

For example, when a synthetic reaction for a material that is used for a middle layer of an electroluminescent device is carried out employing a Pd catalyst, the Pd remains in the material after the reaction. When the Pd remains in the material, problems in terms of luminescence characteristics such as an increase in the luminescence starting voltage, a degradation in the luminescence efficiency, and a degradation in the stability easily occur. In order to solve these problems, it is necessary to purify the material subsequent to the reaction. With regard to a general purification process, a soxhlet extraction method, a reprecipitation method, etc. are known. However, it is difficult to remove Pd by these methods.

The present invention solves the above-mentioned problems and provides a purification process that enables Pd contained in an organic electronics material to be removed effectively, an electroluminescent device middle layer material purified by the process, and an electroluminescent device employing the middle layer material.

That is, the present invention relates to a purification process for an organic electronics material, the process comprising treating, with a phosphorus-containing material, an organic electronics material that contains Pd as an impurity so as to remove the Pd.

Furthermore, the present invention relates to the purification process for an organic electronics material, wherein the organic electronics material is employed as an electroluminescent device middle layer material.

Moreover, the present invention relates to an electroluminescent device middle layer material that is purified by the purification process.

Furthermore, the present invention relates to an electroluminescent device employing the electroluminescent device middle layer material.

The disclosures of the present invention relate to subject matter described in International Patent Application No. PCT/JP2004/008154 filed on Jun. 4, 2004 and Japanese Patent Application Nos. 2003-160760 and 2003-160761 filed on Jun. 5, 2003, and the disclosures therein are incorporated herein by reference.

DESCRIPTION OF THE PREFERRED EMBODIMENT

Modes for carrying out the present invention are explained in detail below.

The purification process of the present invention comprises treating, with a phosphorus-containing material, an organic electronics material that contains Pd as an impurity so as to remove the Pd. The treatment method is not particularly limited, and in the present invention a method in which a solution of an organic electronics material is contacted with a phosphorus-containing material that is insoluble in the solution, a method in which a solution of an organic electronics material (e.g., an organic solvent solution) is washed with a solution of a phosphorus-containing material (e.g., an aqueous solution) that is immiscible with the above-mentioned solution, etc. are preferably used. In the present invention, it is preferable to use the method in which a solution of an organic electronics material is contacted with a phosphorus-containing material that is insoluble in this solution.

As a preferred embodiment, firstly, an organic electronics material solution is obtained by dissolving in an appropriate solvent an organic electronics material that contains Pd as an impurity. Any solvent can be used as long as it dissolves the organic electronics material and the phosphorus-containing material is insoluble therein, and preferred examples thereof include tetrahydrofuran, dichloromethane, chloroform, toluene, xylene, anisole, and a mixed solvent thereof. The concentration of the organic electronics material dissolved therein is preferably set in the range of 0.01 to 10 parts by weight relative to 100 parts by weight of the solvent, and more preferably 0.1 to 5 parts by weight. The dissolution temperature is preferably set at room temperature (25° C.) or higher but not more than the boiling point of the solvent used. The organic electronics material solution thus obtained may be filtered as necessary to remove undissolved material.

The organic electronics material solution thus obtained is subsequently treated with a phosphorus-containing material, and in general the phosphorus-containing material is added to the organic electronics material solution. The amount of phosphorus-containing material is preferably set in the range of 0.01 to 100 parts by weight relative to 1 part by weight of the organic electronics material, and more preferably 0.1 to 20 parts by weight. It is preferable to stir, with a magnetic stirrer, etc., the organic electronics material solution to which the phosphorus-containing material has been added. The stirring temperature is preferably set at 10° C. or higher but not more than the boiling point of the solvent. The stirring time is not particularly limited, but it may be set at a level at which a sufficient effect in reducing the Pd concentration can be obtained, and it is preferably 10 minutes or longer, more preferably 1 hour or longer, and yet more preferably 10 hours or longer. From the viewpoint of workability, etc., the stirring time is preferably set at not more than 100 hours.

With regard to another preferred embodiment, there is a method in which the solution of the organic electronics material is purified by column chromatography using as a packing the phosphorus-containing material that is insoluble in the above-mentioned solution.

In this treatment, the Pd contained in the organic electronics material adsorbs on the phosphorus-containing material.

After completion of stirring, the phosphorus-containing material that has adsorbed the Pd is removed, by filtration, etc., from the organic electronics material to which the phosphorus-containing material has been added and the solvent may further be removed by an evaporator, etc. When the purified organic electronics material is in the form of a syrup, it is difficult to dry even by vacuum drying, and the solvent tends to remain. The syrup-form organic electronics material may therefore be dissolved again in a solvent that can dissolve it, and the solution thus obtained is then added dropwise, while stirring, to a solvent that makes the organic electronics material precipitate, thus precipitating the target organic electronics material in the form of a powder or fibers. With regard to solvents that dissolve the organic electronics material, those described above can be used, and with regard to solvents that make the organic electronics material precipitate, acetone, methanol, ethanol, ethyl acetate, ether, hexane, a mixed solvent thereof, etc. can be cited.

Furthermore, although the present purification process is effective when it is carried out just once, by repeating the process the removal of Pd can be promoted. Although it depends on the amount of Pd contained in the organic electronics material that is to be purified, the present purification process is preferably carried out once to twenty times, and more preferably once to ten times while taking into consideration the yield, the number of steps, and the Pd concentration after purification.

Moreover, the purification process of the present invention may include any other steps.

The 'phosphorus-containing material' referred to in the present invention means a phosphorus atom-containing compound or a material modified by the compound. The 'phosphorus atom-containing compound' is preferably a compound that acts on Pd and has the ability to coordinate to Pd. Examples of the phosphorus atom-containing compound include a phosphine ($R_3P$), a phosphate (($RO)_3PO$), a phosphite (($RO)_3P$), and derivatives thereof. The phosphine may be any of hydrogen phosphide ($PH_3$), a primary phosphine ($RPH_2$), a secondary phosphine ($R_2PH$), and a tertiary phosphine ($R_3P$) (R independently represents a substituted or unsubstituted alkyl group, aryl group, or aralkyl group); detailed examples thereof include diphenylphosphine or a derivative thereof, triphenylphosphine or a derivative thereof, and a trialkylphosphine or a derivative thereof, but the present invention is not limited thereto.

In the present invention, two or more types of phosphorus atom-containing compounds may be used at the same time.

Examples of the material that is modified by the compound include inorganic materials such as silica gel, alumina, zirconia, and titania; and organic materials such as crosslinked polystyrene and polymethacrylate, but they should not be construed as being limited thereto.

Specific examples of the phosphorus-containing material that is used in the present invention include Si-DPP (R45030B) manufactured by Silicycle, Inc; a triphenylphosphine-modified crosslinked polystyrene such as triphenylphosphine, polymer-bound, on styrene-divinylbenzene copolymer (20% crosslinked), manufactured by STREM Chemicals, Inc. (No. 15-6730); triphenylphosphine polystyrene, manufactured by Novabiochem (01-64-0308); triphenylphosphine, polymer-bound, manufactured by Sigma-Aldrich Co. (36645-5); dicyclohexylphenylphosphine, polymer-bound, manufactured by Sigma-Aldrich Co. (63212-0); (4-hydroxyphenyl)diphenylphosphine, polymer-bound, manufactured by Sigma-Aldrich Co. (59673-6); poly (ethylene glycol)triphenylphosphine, manufactured by Sigma-Aldrich Co. (53264-9); and PS-triphenylphosphine, manufactured by Argonaut Technologies, Inc. (800378 to 81).

In the present invention, any organic electronics material may be used as long as Pd is contained as an impurity and, in particular, it is preferable to use an organic electronics material synthesized using a Pd catalyst.

The Pd catalyst may be a Pd (0) complex or a Pd (II) complex. It is also possible to use a Pd (II) salt. Examples of the Pd catalyst include palladium black, palladium chloride, palladium acetate, palladium hydroxide, palladium nitrate, tetraammine palladium (II) chloride hydrate, dinitrodiammine palladium, tetrakis(triphenylphosphine) palladium, tetrakis(tri-o-tolylphosphine) palladium, tetrakis(tri-tert-butylphosphine) palladium, bis(1,2-bis(diphenylphosphino) ethane) palladium, bis(1,1'-bis(diphenylphosphino) ferrocene) palladium, tetrakis(triethylphosphite) palladium, tris(dibenzylideneacetone) dipalladium, dichlorobis(triphenylphosphine) palladium, di-μ-chlorobis(η-allyl) palladium, dichlorobis(tri-tert-butylphosphine) palladium, [1,1'-bis(diphenylphosphino) ferrocene]palladium (II) chloride, bis(acetylacetonato) palladium, dichlorobis(benzonitrile) palladium, dichlorobis(acetonitrile) palladium, and palladium propionate.

With regard to a method for synthesizing an organic electronics material using a Pd catalyst, there are the Heck reaction in which an aryl halide or a vinyl halide is reacted with a terminal olefin to give a substituted olefin, the Sonogashira coupling reaction in which an aryl halide or a haloalkane is reacted with a terminal acetylene to give a disubstituted acetylene, the Stille coupling reaction in which an aryl halide or a vinyl halide is reacted with an organotin compound, the Suzuki coupling reaction in which an aryl halide or a vinyl halide is reacted with a boron compound, etc., but they should not be construed as being limited thereto.

Examples of the organic electronics material include polymers containing, as a main backbone, a poly(arylene) such as polyphenylene, polyfluorene, polyphenanthrene, or polypyrene, or a derivative thereof; a poly(heteroarylene) such as polythiophene, polyquinoline, or polycarbazole, or a derivative thereof; a poly(arylenevinylene), or a derivative thereof; and a poly(aryleneethynylene), or a derivative thereof. Furthermore, examples thereof include polymers and oligomers having, as a unit (that is, not limited to a structure in the main backbone and may be a side chain structure), a structure of benzene, naphthalene, anthracene, phenanthrene, chrysene, rubrene, pyrene, perylene, indene, azulene, adamantane, fluorene, fluorenone, dibenzofuran, carbazole, dibenzothiophene, furan, pyrrole, pyrroline, pyrrolidine, thiophene, dioxolane, pyrazole, pyrazoline, pyrazolidine, imidazole, oxazole, thiazole, oxadiazole, triazole, thiadiazole, pyran, pyridine, piperidine, dioxane, morpholine, pyridazine, pyrimidine, pyrazine, piperazine, triazine, trithiane, norbornene, benzofuran, indole, benzothiophene, benzimidazole, benzoxazole, benzothiazole, benzothiadiazole, benzoxadiazole, purine, quinoline, isoquinoline, coumarin, cinnoline, quinoxaline, acridine, phenanthroline, phenothiazine, flavone, triphenylamine, acetylacetone, dibenzoylmethane, picolinic acid, silole, porphyrin, or a coordination compound of a metal such as iridium; or a derivative thereof. It is also possible to employ a low molecular weight compound having these backbones.

In the present invention, it is particularly preferable to employ a polymer containing as the main backbone a poly (arylene) or a derivative thereof, or a poly(heteroarylene) or a derivative thereof. It is also preferable to employ a polymer containing, as the unit, benzene, naphthalene, anthracene, phenanthrene, pyrene, fluorene, dibenzofuran, carbazole, dibenzothiophene, furan, thiophene, oxadiazole, triazole, thiadiazole, pyridine, triazine, benzothiophene, benzimidazole, benzoxazole, benzothiazole, benzothiadiazole, benzoxadiazole, quinoline, isoquinoline, acridine, phenanthroline, triphenylamine, acetylacetone, dibenzoylmethane, or a coordination compound of a metal such as iridium; or a derivative thereof.

The weight-average molecular weight of the polymer is preferably 1,000 or greater, more preferably 10,000 or greater, and yet more preferably 100,000 or greater, and in order for the viscosity when dissolved in a solvent to be such that it is possible to stir, the weight-average molecular weight is preferably no more than 1,000,000.

The 'middle layer material' referred to in the present invention means a material used for an electron or positive hole injection layer, an electron or positive hole transporting layer, an electron or positive hole blocking layer, etc. of an electroluminescent device.

The general structure of an electroluminescent device is not particularly limited, and is described in, for example, U.S. Pat. Nos. 4,539,507 and 5,151,629. A polymer-containing electroluminescent device is described in, for example, International Publication WO90/13148 and EP-A-0443861.

These electroluminescent devices usually include an electroluminescent layer (light-emitting layer) between cathode and anode electrodes, at least one of which is transparent. Furthermore, at least one layer selected from an electron injection layer, an electron transporting layer, and a positive hole blocking layer may be inserted between the electroluminescent layer (light-emitting layer) and the cathode. Moreover, at least one layer selected from a positive hole injection layer, a positive hole transporting layer, and an electron blocking layer may be inserted between the electroluminescent layer (light-emitting layer) and the anode. As a material for the cathode, for example, a metal or metal alloy such as Li, Ca, Ba, Mg, Al, In, Cs, Mg/Ag, or LiF is preferable. As a material for the anode, a metal (e.g. Au) or another material having metallic conductivity such as, for example, an oxide (e.g. ITO: indium oxide/tin oxide) on a transparent substrate (e.g. a glass or a transparent polymer) can be used.

In the present invention, in order to use an organic electronics material in an electroluminescent device, it may be layered on a substrate as a solution of a single substance or a mixture, or in the form of a solid, using a method known to a person skilled in the art such as, for example, an ink-jet method, a casting method, a dipping method, a printing method, or a spin coating method, but they should not be construed as being limited thereto. Such a layering method may usually be carried out in the temperature range of −20° C. to +300° C., preferably 10° C. to 100° C., and particularly preferably 15° C. to 50° C. Drying of the solution of the organic electronics material thus layered may usually be carried out by drying at normal temperature, drying while heating by means of a hot plate, etc.

Examples of the solvent used for the solution include chloroform, methylene chloride, dichloroethane, tetrahydrofuran, toluene, xylene, mesitylene, anisole, acetone, methyl ethyl ketone, ethyl acetate, butyl acetate, and ethyl cellosolve acetate.

The organic electronics material purified by the purification process of the present invention may be used as an organic electronics material for an electroluminescent material, an electrochromic material, a laser material, a material for an electronic element such as a diode, a transistor, or a FET, a solar cell material, a sensor material, etc. In particular, the organic electronics material purified by the purification process of the present invention is preferably used as an electroluminescent material, and is more preferably used as an electroluminescent device middle layer material.

As is clear from Examples and Comparative Examples, the process for purifying an organic electronics material of the present invention exhibits an excellent effect in removing impurities, and is suitable for the production of an electroluminescent device middle layer material and an electroluminescent device having excellent luminescence characteristics, stability, etc.

EXAMPLES

The present invention is explained further in detail below with reference to Examples, but the present invention is not limited by the Examples below.

Synthetic Examples 1 and 2 Synthesis of Polymer

A reaction was carried out using a dedicated polytetrafluoroethylene reaction vessel. With regard to a solvent, oxygen in the solvent was removed using nitrogen gas for 30 minutes or longer before use. The reaction vessel was charged with monomers shown in Table 1 and further, in a glove box under an atmosphere of nitrogen, with a 3 vol % anisole solution (8 ml) of tricaprylmethylammonium chloride and an 8 mM anisole solution (100 μL) of $Pd(PPh_3)_4$. After the monomers were dissolved by stirring, a 2M aqueous solution (5.3 ml) of $K_2CO_3$ was added. The reaction vessel was set in a microwave reaction device, and a Suzuki coupling reaction was carried out while stirring under microwave irradiation with conditions shown in Table 2. As a reference for controlling the temperature, a mixture of all the reagents and solvents other than the monomers was used. After the reaction was completed, the reaction mixture was poured into methanol-water (ratio by volume (the same applies below) 9:1) (90 mL). A precipitate thus formed was filtered by suction and washed with methanol-water (9:1). The precipitate thus obtained was dissolved again in anisole and reprecipitated from methanol-acetone (8:3). The precipitate thus obtained was filtered by suction and washed with methanol-acetone (8:3). Reprecipitation was carried out again from methanol-acetone (8:3) to give a crude polymer product. The polymer thus obtained was subjected to ICP emission analysis, and the results are given in Table 3.

A quantitative method for Pd by ICP emission analysis was as follows.

5 mg of a sample was weighed, sulfuric acid, nitric acid, perchloric acid, and hydrofluoric acid were added thereto, it was decomposed by heating, the decomposed substance was dissolved in dilute aqua regia to give a test sample, and measurement was carried out using an SPS3000 ICP emission analyzer manufactured by Seiko Instruments Inc. (the same applies below).

TABLE 1

| | Monomer 1 | Monomer 2 |
|---|---|---|
| Synthetic Example 1 | 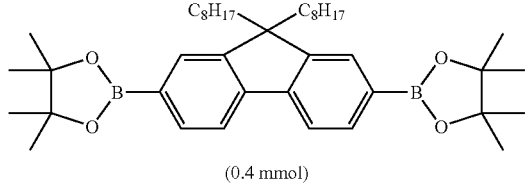<br>(0.4 mmol) | 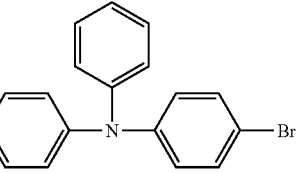<br>(0.4 mmol) |
| Synthetic Example 2 | 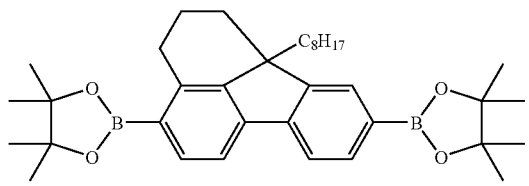<br>(0.4 mmol) | 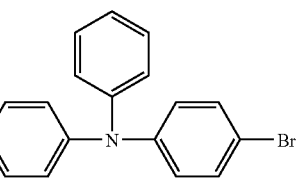<br>(0.4 mmol) |

TABLE 2

| | Temperature increase program 1 | Temperature increase program 2 | Maximum microwave output (W) |
|---|---|---|---|
| Synthetic Examples 1 and 2 | Room temperature → 90° C./10 min | 90° C./120 min | 300 |

TABLE 3

| | Pd content (ppm) |
|---|---|
| Synthetic Example 1 | 420 |
| Synthetic Example 2 | 360 |

Examples 1 and 2

Purification of Polymer

The polymer obtained in Synthetic Examples 1 and 2 was dissolved in toluene (10 ml relative to 100 mg of polymer), triphenylphosphine, polymer-bound on styrene-divinylbenzene copolymer (200 mg relative to 100 mg of polymer, 15-6730, manufactured by STREM Chemicals Inc.) was added, and stirring was carried out overnight. After stirring was completed, the triphenylphosphine, polymer-bound on styrene-divinylbenzene copolymer was removed by filtration, and the filtrate was concentrated using a rotary evaporator. The residue was dissolved in toluene, and then reprecipitated from methanol-acetone (8:3). The precipitate thus formed was filtered by suction and washed with methanol-acetone (8:3). The precipitate thus obtained was dried in vacuum to give a polymer. The polymer thus obtained was subjected to ICP emission analysis, and the results are given in Table 4.

TABLE 4

| | Crude polymer product | Pd content (ppm) |
|---|---|---|
| Example 3 | Synthetic Example 1 | <50 |
| Example 4 | Synthetic Example 2 | <50 |

Examples 3 and 4

Fabrication of Organic EL Devices

A glass substrate with a 1.6 mm wide ITO (indium tin oxide) patterning was spin-coated at 4000 rpm with a PEDOT:PSS (CH8000-LVW233, manufactured by H.C. Starck-VTech Ltd.) layer, and dried by heating on a hot plate in air at 200° C./10 minutes. Subsequently, under an atmosphere of dry nitrogen gas (dew point −50° C. or less, oxygen concentration 10 ppm or less) a toluene solution (0.5 wt %) of the polymer obtained in Examples 1 and 2 was applied by spin coating at 3000 rpm to give a middle layer (film thickness 30 nm). It was subsequently heated under an atmosphere of dry nitrogen gas on a hot plate at 200° C./10 minutes, cooled to room temperature, and then immersed in toluene. It was further spin-coated at 3000 rpm with a toluene solution (1.5 wt %) of the polymer (1) shown below under an atmosphere of dry nitrogen gas to give a light-emitting layer (film thickness 100 nm), and dried under an atmosphere of dry nitrogen gas by heating on a hot plate at 80° C./5 minutes. The glass substrate thus obtained was transferred to vacuum vapor deposition equipment, and an electrode was formed on the light-emitting layer in the order Ba (film thickness 5 nm) and Al (film thickness 100 nm). After the electrode was formed, the substrate was moved into a glove box without exposing it to the atmosphere, and under an environment of a dew point of −90° C. or less and an oxygen concentration of 1 ppm or less, a sealing glass formed by making a 0.4 mm recess in 0.7 mm alkali-free glass was sealed to the ITO substrate by bonding with a photocurable epoxy resin. With regard to the room-temperature properties of the organic EL device, current-voltage characteristics were measured using a picoammeter 4140B manufactured by Hewlett Packard, and luminance was measured using an SR-3 manufactured by Topcon Corp. When a voltage was applied so that the ITO was the positive electrode and the Ba/Al was the negative electrode, the maximum luminance, the maximum power efficiency at a luminance of 1000 to 3000 cd/m$^2$, and the luminance halflife from 100 cd/m$^2$ were as shown in Table 5.

TABLE 5

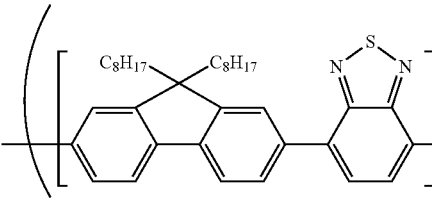

(1)

(x:y = 4:1)

| | Middle layer material | Maximum luminance (cd/m$^2$) | Maximum power efficiency (lm/W) | Luminance halflife (h) |
|---|---|---|---|---|
| Example 3 | Example 1 | 19599 | 5.478 | 137 |
| Example 4 | Example 2 | 10322 | 2.503 | 12 |

Comparative Examples 1 and 2

Organic EL devices were fabricated in the same method as in Examples 3 and 4 without purifying the polymers obtained in Synthetic Examples 1 and 2, and the results are given in Table 6.

TABLE 6

| | Middle layer material | Maximum luminance (cd/m$^2$) | Maximum power efficiency (lm/W) | Luminance halflife (h) |
|---|---|---|---|---|
| Comp. Ex. 1 | Synthetic Example 1 | 15321 | 4.318 | 114 |
| Comp. Ex. 2 | Synthetic Example 2 | 9057 | 2.138 | 4 |

The purification process of the present invention is an excellent process that enables Pd contained in an organic electronics material to be removed effectively. Furthermore, an organic EL (electroluminescent) device employing a middle layer material obtained by the purification process of the present invention has excellent properties such as luminance, power efficiency, and lifetime compared with an organic EL device employing a conventional middle layer material.

What is claimed is:

1. A method of making an electroluminescent device, comprising:
   a purification step of treating, with a material modified by a phosphorus atom-containing compound, an organic electronics material that contains Pd as an impurity so as to remove Pd; and
   a step of making a middle layer of an electroluminescent device using the organic electronics material which is purified at the purification step,
   wherein the phosphorous atom-containing compound is any one of a phosphine ($R_3P$), a phosphate (($RO)_3PO$), a phosphite (($RO)_3P$) and derivatives thereof, where R independently represents a hydrogen atom, a substituted or unsubstituted alkyl group, an aryl group, or an aralkyl group;
   wherein the material is any one of silica gel, alumina, zirconia, titania, crosslinked polystyrene, polymethacrylate and styrene-divinylbenzene copolymer.

2. The method of making an electroluminescent device according to claim 1,
   wherein the phosphine is any one of hydrogen phosphide $PH_3$, a primary phosphine $RPH_2$, a secondary phosphine $R_2PH$, and a tertiary phosphine $R_3P$, where R independently represents a substituted or unsubstituted alkyl group, aryl group, or aralkyl group.

* * * * *